(12) United States Patent
Tada et al.

(10) Patent No.: US 10,305,485 B2
(45) Date of Patent: May 28, 2019

(54) PROGRAMMABLE LOGIC INTEGRATED CIRCUIT, SEMICONDUCTOR DEVICE, AND CHARACTERIZATION METHOD

(71) Applicant: NEC Corporation, Minato-ku, Tokyo (JP)

(72) Inventors: Ayuka Tada, Tokyo (JP); Noboru Sakimura, Tokyo (JP); Makoto Miyamura, Tokyo (JP); Yukihide Tsuji, Tokyo (JP); Ryusuke Nebashi, Tokyo (JP); Xu Bai, Tokyo (JP); Toshitsugu Sakamoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/752,330

(22) PCT Filed: Aug. 31, 2016

(86) PCT No.: PCT/JP2016/003979
§ 371 (c)(1),
(2) Date: Feb. 13, 2018

(87) PCT Pub. No.: WO2017/038095
PCT Pub. Date: Mar. 9, 2017

(65) Prior Publication Data
US 2019/0052273 A1 Feb. 14, 2019

(30) Foreign Application Priority Data

Sep. 2, 2015 (JP) .................................. 2015-172470

(51) Int. Cl.
H03K 19/177 (2006.01)
H01L 27/24 (2006.01)
(Continued)

(52) U.S. Cl.
CPC ..... *H03K 19/17748* (2013.01); *G06F 17/505* (2013.01); *G06F 17/5031* (2013.01);
(Continued)

(58) Field of Classification Search
None
See application file for complete search history.

(56) References Cited

U.S. PATENT DOCUMENTS 7,447,828 B2 * 11/2008 Mouttet ............... H03K 19/177
326/101
8,924,766 B2 * 12/2014 Pelloie ..................... G06F 1/10
702/57
(Continued)

FOREIGN PATENT DOCUMENTS

JP 2005-101535 A 4/2005
JP 2013-179579 A 9/2013
(Continued)

OTHER PUBLICATIONS

International Search Report for PCT Application No. PCT/JP2016/003979, dated Oct. 4, 2016.
(Continued)

*Primary Examiner* — Minh D A
*Assistant Examiner* — James H Cho

(57) ABSTRACT

An object of the present invention is to provide a method for effectively performing characterization for circuit verification by static timing analysis, of a programmable logic integrated circuit including a crossbar switch including a resistance-variable element, and a logic circuit logically configured with the crossbar switch, wherein: the programmable logic integrated circuit is divided into a plurality of leaf cells including a plurality of load circuits including a part of the crossbar switch, and a power supply element input to the crossbar switch; the leaf cell is divided into
(Continued)

delay paths each including a base leaf cell and a correction leaf cell; and circuit verification is performed based on a delay information library in which a delay time for the base leaf cell and a correction delay for the correction leaf cell are integrated into a delay time for the leaf cell.

16 Claims, 14 Drawing Sheets

(51) Int. Cl.
  *G06F 17/50* (2006.01)
  *H01L 45/00* (2006.01)
(52) U.S. Cl.
  CPC ...... *G06F 17/5081* (2013.01); *H01L 27/2436* (2013.01); *H01L 45/1206* (2013.01)

(56) References Cited

U.S. PATENT DOCUMENTS

| | | | | |
|---|---|---|---|---|
| 9,059,689 | B2* | 6/2015 | Kato | H03K 5/05 |
| 9,881,123 | B1* | 1/2018 | Goyal | G06F 17/5031 |
| 2009/0219051 | A1* | 9/2009 | Zhang | H03K 19/17752 |
| | | | | 326/38 |
| 2011/0007554 | A1 | 1/2011 | Kaeriyama et al. | |
| 2011/0320996 | A1 | 12/2011 | Awashima et al. | |
| 2013/0181180 | A1 | 7/2013 | Tada et al. | |
| 2015/0097608 | A1* | 4/2015 | Tiwari | H03K 5/159 |
| | | | | 327/269 |
| 2015/0204944 | A1 | 7/2015 | Hamada et al. | |
| 2016/0065218 | A1 | 3/2016 | Oda | |
| 2016/0268265 | A1 | 9/2016 | Kurokawa | |
| 2018/0157779 | A1* | 6/2018 | Sakimura | H01L 21/82 |

FOREIGN PATENT DOCUMENTS

| | | |
|---|---|---|
| JP | 2014-060537 A | 4/2014 |
| JP | 2015-026901 A | 2/2015 |
| WO | 2010/100871 A1 | 9/2010 |
| WO | 2012/043502 A1 | 4/2012 |

OTHER PUBLICATIONS

English translation of Written opinion for PCT Application No. PCT/JP2016/003979.

* cited by examiner

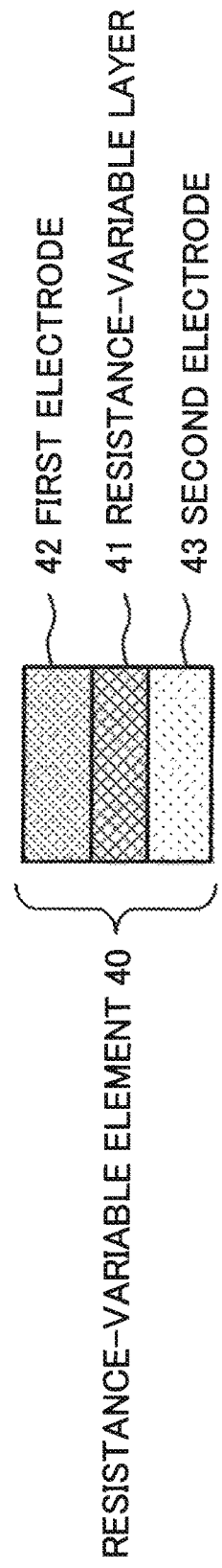

Fig.5B

| RESISTANCE STATE | APPLIED VOLTAGE | |
| --- | --- | --- |
| | FIRST ELECTRODE | SECOND ELECTRODE |
| HIGH RESISTANCE → LOW RESISTANCE | HIGH | LOW |
| LOW RESISTANCE → HIGH RESISTANCE | LOW | HIGH |

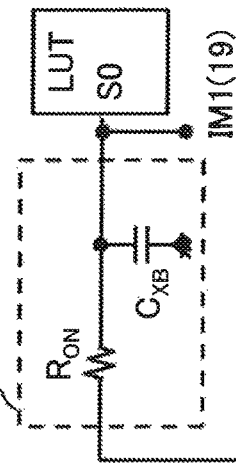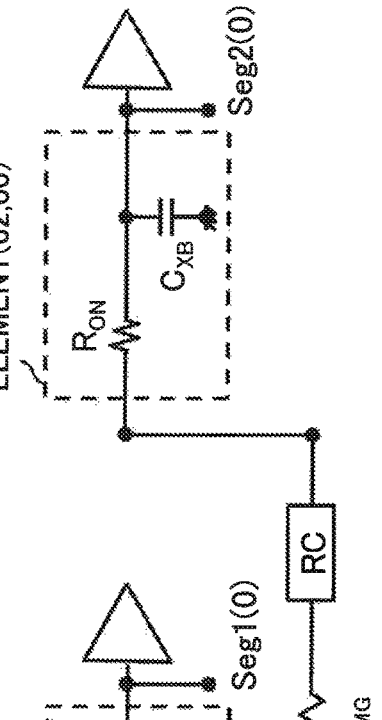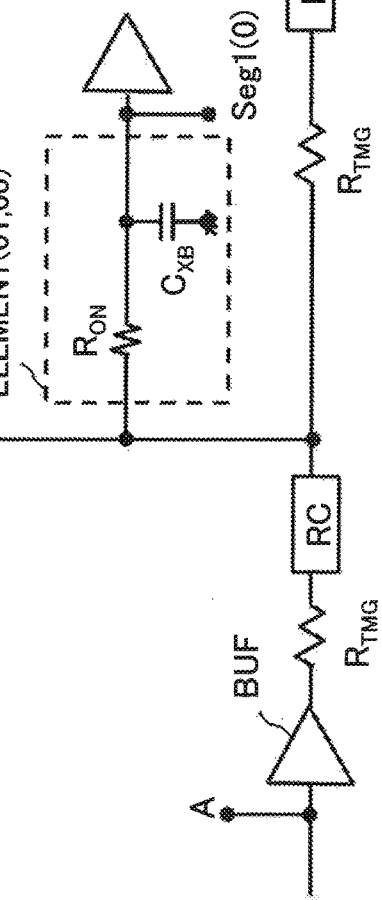
Fig.12

PROGRAMMABLE LOGIC INTEGRATED CIRCUIT, SEMICONDUCTOR DEVICE, AND CHARACTERIZATION METHOD

This application is a National Stage Entry of PCT/JP2016/003979 filed on Aug. 31, 2016, which claims priority from Japanese Patent Application 2015-172470 filed on Sep. 2, 2015, the contents of all of which are incorporated herein by reference, in their entirety.

TECHNICAL FIELD

The present invention relates to a semiconductor device, and more particularly, to a semiconductor device using a programmable logic integrated circuit including a resistance-variable element.

BACKGROUND ART

A semiconductor integrated circuit includes a transistor layer formed on a semiconductor substrate, and a wiring layer formed on the semiconductor substrate to connect transistors. Transistors and wiring patterns are determined at a design stage of the integrated circuit, and thus a connection between the transistors cannot be changed after production of the semiconductor integrated circuit. On the other hand, in a reconfigurable programmable logic integrated circuit such as a field programmable gate array (FPGA), circuit information about an arithmetic operation, a wiring connection, and the like is stored in a memory, thereby enabling to change the wiring connection after production of the programmable logic integrated circuit.

Examples of memory elements for storing the circuit information include a static random access memory (SRAM) cell, an anti-fuse, a floating gate metal-oxide-semiconductor (MOS) transistor, and the like. However, these elements are formed in a layer in which transistors are formed, which results in an increase in chip area and an increase in production cost. In addition, an area of a wiring switch for changing a connection between logic operation circuits increases, which results in a reduction in a ratio of the logic operation circuits to the chip area. This leads to deterioration in operation speed of circuits mounted in an FPGA and an increase in operating power.

PTL 1 and PTL 2 disclose a programmable logic integrated circuit using a resistance-variable element as a memory element for storing circuit information. The programmable logic integrated circuit disclosed in PTL 1 and PTL 2 includes a resistance-variable element composed of a solid electrolyte material including metallic ions between a first wire and a second wire formed on an upper part of the first wire. A polarity of a voltage to be applied to the resistance-variable element is changed to thereby enable to change a resistance value of the element. A ratio of a low-resistance state (ON state) to a high-resistance state (OFF state) is the fifth power of 10, or more. Thus, the resistance-variable element functions as a switch for electrically connecting the first wire to the second wire, or disconnecting the first wire from the second wire.

The resistance-variable element can implement a memory function and a switch function, and thus a switch cell can be implemented by one resistance-variable element. According to PTL 1, a resistance-variable element is disposed at each intersection between a first wiring group and a second wiring group, and thereby a crossbar switch circuit capable of freely connecting any wire in the first wiring group to any wire in the second wiring group can be configured with small dimensions. As a result, a chip area can be reduced and operation performance can be improved by increasing a ratio of logic operation circuits on a chip. Further, since the resistance-variable element is non-volatile, there is another advantage that time and labor for loading circuit information at a time of start-up can be saved.

CITATION LIST

Patent Literature

[PTL 1] Japanese Unexamined Patent Application Publication No. 2005-101535
[PTL 2] International Patent Publication No. WO 2012/043502

SUMMARY OF INVENTION

Technical Problem

In circuit design of a programmable logic integrated circuit, in general, a logical specification is expressed by using a hardware description language or the like, and logic synthesis and layout wiring are carried out based on the logical specification by using a design tool. In addition, verification of a function or a timing for the obtained layout wiring is included in a series of processes. Static timing analysis (abbreviated as STA) is primarily used for timing verification.

STA is a method for verifying whether to operate at a desired clock frequency, without using any test pattern. Specifically, propagation delay times for all paths from a D-type flip-flop (abbreviated as DFF) present in a logic circuit to a subsequent-stage DFF are integrated. It is determined whether or not this delay value violates a condition (timing constraint) for set-up time or hold time defined in an input of the DFF. When a logic simulator as typified by Simulation Program with Integrated Circuit Emphasis (SPICE) or the like is used, the verification can be performed for a short period of time even in a circuit size that requires an extremely long period for verification.

Input information necessary for executing the STA is a netlist, timing constraint information, and a delay information library. The netlist is a connection information file described in a gate level. The delay information library includes information such as a delay time for each instance obtained by a logic simulator. It is necessary to create the delay information library for each configuration of the programmable logic integrated circuit or each transistor model, and a series of the operations is referred to as characterization.

An internal core of the programmable logic integrated circuit is composed of a logic circuit block including a multiplier circuit block, a random access memory (RAM) block used as a memory in a user circuit, a look-up table (abbreviated as LUT), and a DFF, and a crossbar switch capable of freely switching a connection between these blocks. In a case of obtaining propagation delay information or power for each element (referred to as a leaf cell) constituting a circuit, a propagation delay time is generally a two-dimensional matrix composed of a slope of an input waveform and an output load capacitance. In the crossbar switch, the number of elements of the two-dimensional matrix tends to extremely increase. Accordingly, in the characterization, the crossbar switch is most rate-limiting.

PTL 1 and PTL 2 fail to disclose a method for effectively performing characterization of a crossbar switch using a resistance-variable element. The method for effectively performing characterization of a crossbar switch using a resistance-variable element has not been established.

The present invention has been made in view of the above-described problems, and an object of the present invention is to provide a method for effectively performing characterization for circuit verification by static timing analysis, of a programmable logic integrated circuit including a crossbar switch using a resistance-variable element.

Solution to Problem

A programmable logic integrated circuit according to the present invention is a programmable logic integrated circuit including: a crossbar switch including a resistance-variable element; and a logic circuit logically configured with the crossbar switch, wherein: the programmable logic integrated circuit is divided into a plurality of leaf cells including a plurality of load circuits including a part of the crossbar switch, and a power supply element input to the crossbar switch; the leaf cell is divided into delay paths each including a base leaf cell and a correction leaf cell; and circuit verification is performed based on a delay information library in which a delay time for the base leaf cell and a correction delay for the correction leaf cell are integrated into a delay time for the leaf cell.

A semiconductor device according to the present invention includes a programmable logic integrated circuit including a crossbar switch including a resistance-variable element, and a logic circuit logically configured with the crossbar switch, wherein: the programmable logic integrated circuit is divided into a plurality of leaf cells including a plurality of load circuits including a part of the crossbar switch, and a power supply element input to the crossbar switch; the leaf cell is divided into delay paths each including a base leaf cell and a correction leaf cell; and circuit verification is performed based on a delay information library in which a delay time for the base leaf cell and a correction delay for the correction leaf cell are integrated into a delay time for the leaf cell.

A characterization method according to the present invention is a characterization method for circuit verification of a programmable logic integrated circuit including a crossbar switch including a resistance-variable element, and a logic circuit logically configured with the crossbar switch, the characterization method including:

dividing the programmable logic integrated circuit into a plurality of leaf cells including a plurality of load circuits including a part of the crossbar switch, and a power supply element input to the crossbar switch;

dividing the leaf cell into delay paths each including a base leaf cell and a correction leaf cell; and integrating a delay time for the base leaf cell and a correction delay for the correction leaf cell into a delay time for the leaf cell.

Advantageous Effects of Invention

According to the present invention, it is possible to provide a method for effectively performing characterization for circuit verification by static timing analysis, of a programmable logic integrated circuit including a crossbar switch using a resistance-variable element.

BRIEF DESCRIPTION OF DRAWINGS

FIG. 5A is a diagram illustrating a configuration of a resistance-variable element of the programmable logic integrated circuit according to the second example embodiment of the present invention;

FIG. 5B is a table illustrating an operation method for switching the resistance-variable element of the programmable logic integrated circuit according to the second example embodiment of the present invention;

FIG. 12 is a diagram illustrating a connection example 2 of leaf cells including the crossbar switch of the programmable logic integrated circuit according to the second example embodiment of the present invention.

DESCRIPTION OF EMBODIMENTS

Example embodiments of the present invention will be described in detail below with reference to the drawings. In the example embodiments described below, technically preferable limitations are made for carrying out the present invention, but the scope of the invention is not limited to the following example embodiments.

First Example Embodiment

Figure 1:
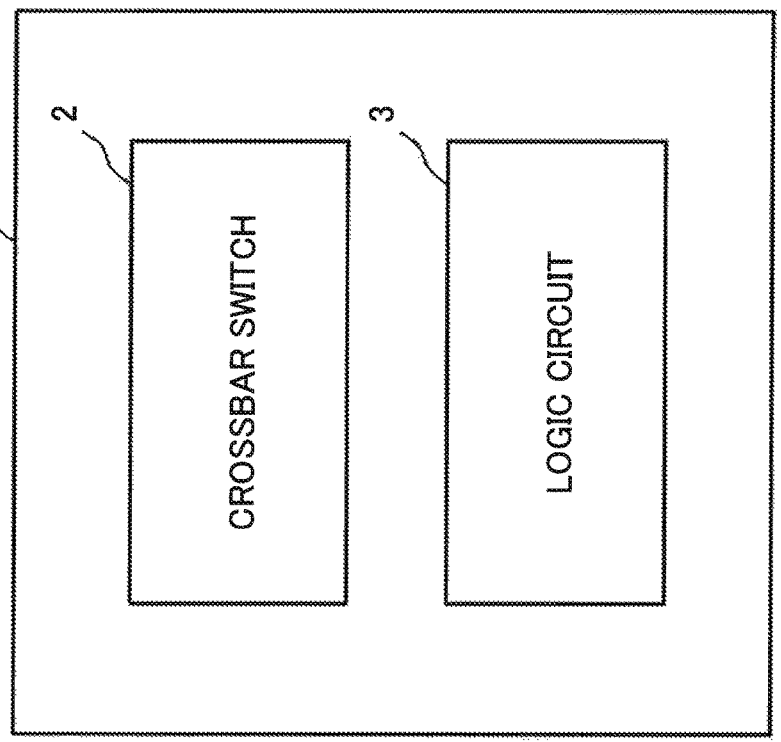
FIG. 1 is a block diagram illustrating a configuration of a programmable logic integrated circuit according to a first example embodiment of the present invention.

FIG. 1 is a block diagram illustrating a configuration of a programmable logic integrated circuit according to a first example embodiment of the present invention. A programmable logic integrated circuit 1 according to this example embodiment includes a crossbar switch 2 including a resistance-variable element, and a logic circuit 3 which is logically configured with the crossbar switch 2, wherein the programmable logic integrated circuit 1 is divided into a plurality of leaf cells including a plurality of load circuits including a part of the crossbar switch 2, and a power supply element input to the crossbar switch 2, the leaf cell is divided into delay paths each including a base leaf cell and a correction leaf cell, and circuit verification is performed based on a delay information library in which a delay time for the base leaf cell and a correction delay for the correction leaf cell are integrated into a delay time for the leaf cell.

Figure 2:
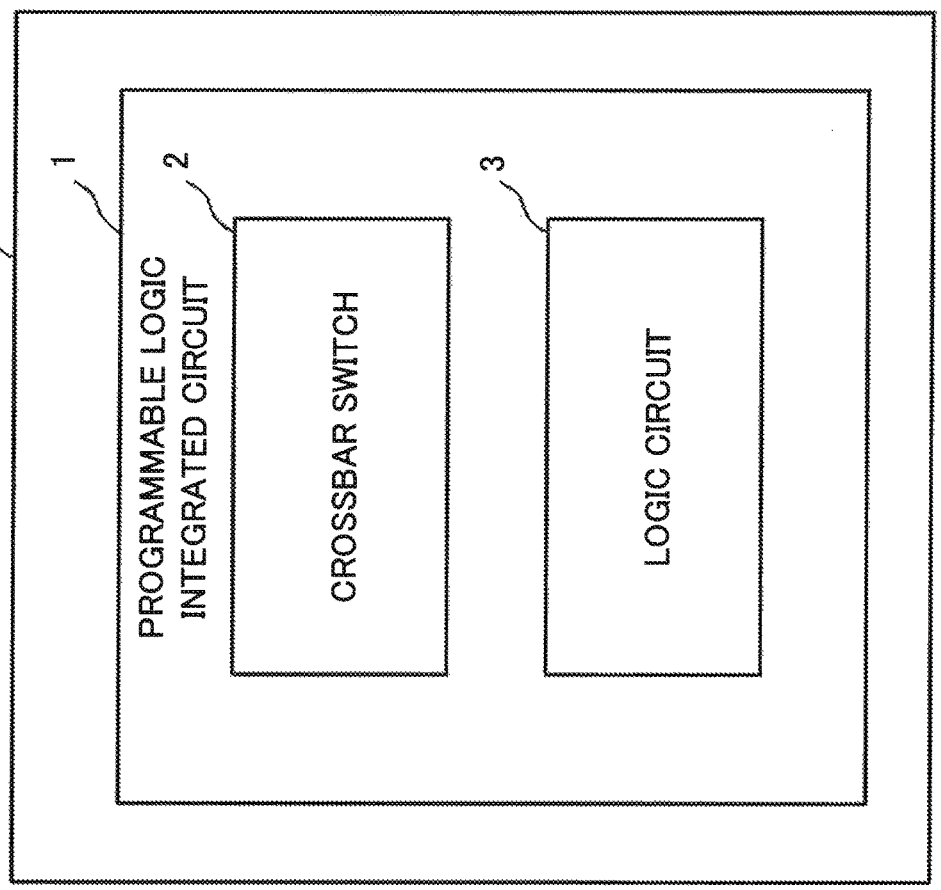
FIG. 2 is a block diagram illustrating a configuration of a semiconductor device according to the first example embodiment of the present invention.

FIG. 2 is a block diagram illustrating a configuration of a semiconductor device according to the first example embodiment of the present invention. A semiconductor device 4 according to this example embodiment includes the programmable logic integrated circuit 1 including the crossbar switch 2 including the resistance-variable element, and the logic circuit 3 logically configured with the crossbar switch 2. The programmable logic integrated circuit 1 is divided into a plurality of leaf cells including a plurality of load circuits including a part of the crossbar switch 2, and a power supply element input to the crossbar switch 2, the leaf cell is divided into delay paths each including a base leaf cell and a correction leaf cell, and circuit verification is performed based on a delay information library in which a delay time for the base leaf cell and a correction delay for the correction leaf cell are integrated into a delay time for the leaf cell.

A characterization method according to this example embodiment is a characterization method for circuit verification of the programmable logic integrated circuit 1 including the cross switch 2 including the resistance-variable element, and the logic circuit 3 logically configured with the crossbar switch 2, the characterization method including: dividing the programmable logic integrated circuit 1 into a plurality of leaf cells including a plurality of load circuits including a part of the crossbar switch 2, and the power supply element input to the crossbar switch 2; dividing the leaf cells into delay paths each including a base leaf cell and a correction leaf cell; and integrating a delay time for the base leaf cell and a correction delay for the correction leaf cell into a delay time for the leaf cells.

According to this example embodiment, it is possible to provide a method for effectively performing characterization for circuit verification by static timing analysis of a programmable logic integrated circuit including a crossbar switch using a resistance-variable element.

Second Example Embodiment

Figure 3:
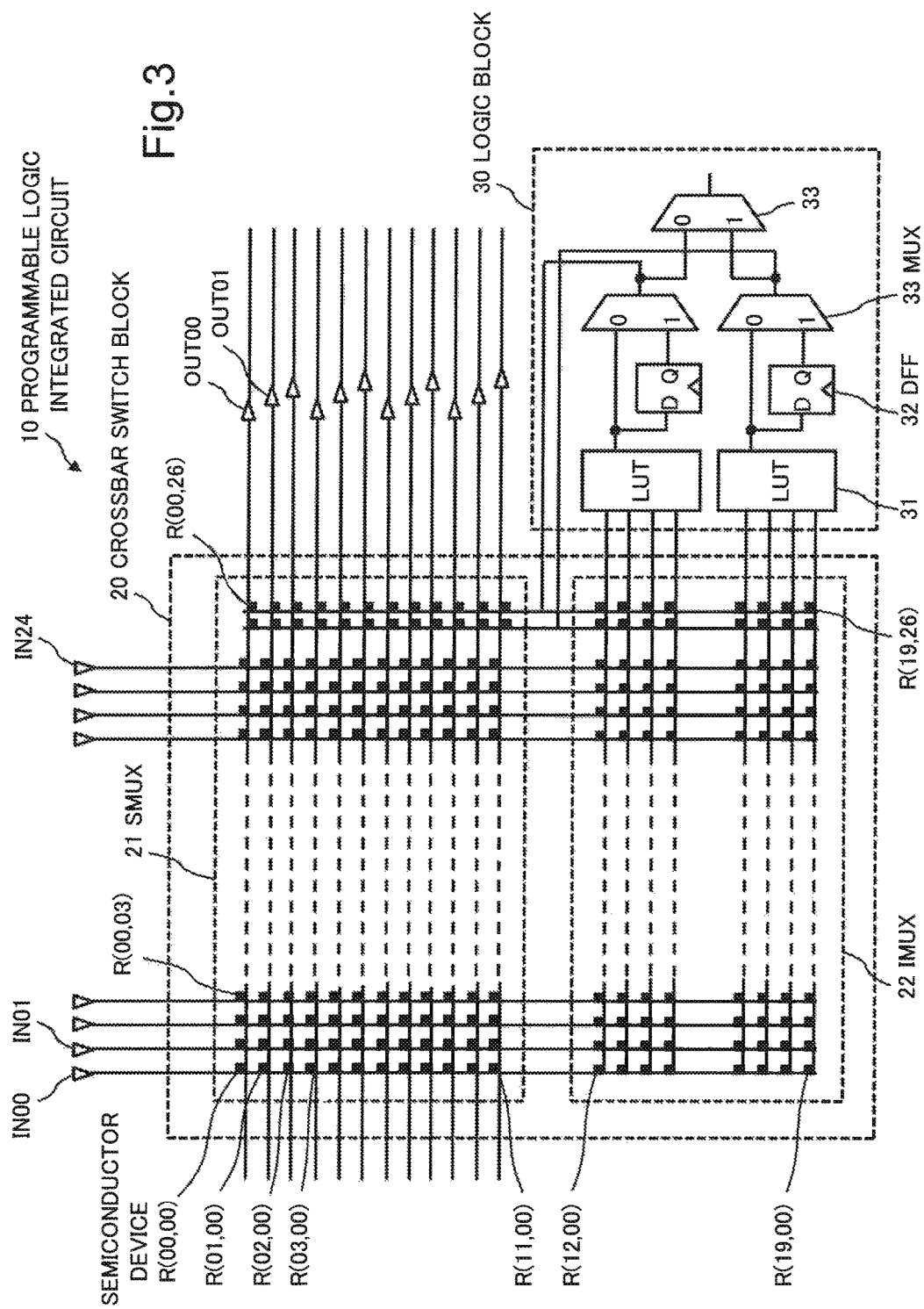
FIG. 3 is a diagram illustrating a configuration of a programmable logic integrated circuit according to a second example embodiment of the present invention.

FIG. 3 is a block diagram illustrating a programmable logic integrated circuit according to a second example embodiment of the present invention. A programmable logic integrated circuit 10 according to this example embodiment includes a crossbar switch block 20 including a resistance-variable element, and a logic block 30 logically configured with the crossbar switch block 20.

The logic block 30 (configurable logic block, which is abbreviated as CLB) includes two 4-input LUTs 31, two DFFs 32, and three 2-input multiplexers (MUXs) 33. The crossbar switch block 20 includes an input multiplexer (IMUX) 22 for determining an input to the LUTs 31, and a switch multiplexer (SMUX) 21 for determining an input/output wire with an adjacent programmable logic integrated circuit.

Figure 4:
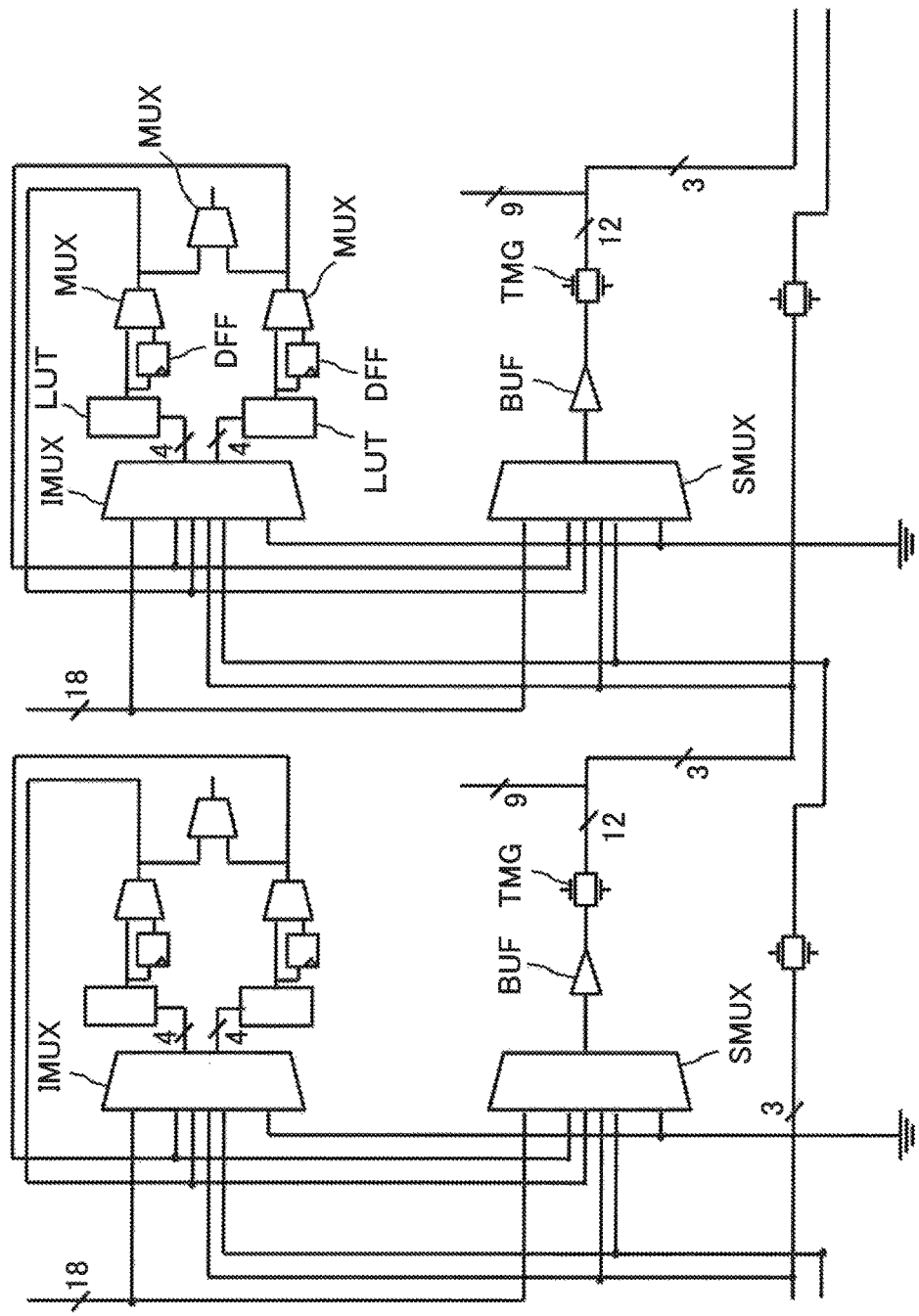
FIG. 4 is a diagram illustrating a connection wire between programmable logic integrated circuits according to the second example embodiment of the present invention.

FIG. 4 is a diagram illustrating connection wires between programmable logic integrated circuits according to this example embodiment. Numbers in the drawing each represent the number of wires. A wire with no number represents one wire as illustrated in the drawing.

The number of output wires of the IMUX in the crossbar switch block 20 is eight in total because the output wires are connected to two 4-input LUTs. The SMUX includes three outputs for each of CLBs adjacent to each other vertically and horizontally, and includes 12 (3×4=12) output wires.

At an output from the SMUX to the adjacent CLB, a buffer (abbreviated as BUF) and a transmission gate (abbreviated as TMG) are provided. The output from the SMUX is input to the adjacent CLB of a subsequent stage via the BUF, and the BUF is treated as a power supply element for the subsequent-stage CLB. The TMG is disposed to prevent a write voltage from being applied to CLBs other than a selected CLB when data are written into the resistance-variable element, and the TMG is constantly in an ON state during operation of the logic circuit.

A segment includes two wiring resources, and 27 input lines in total of 24 (2×3×4=24) data lines, two output lines of an LUT in the CLB, and a ground line (omitted in FIG. 3). The IMUX and the SMUX are connected with a data line. The crossbar switch block 20 having a configuration as illustrated in FIGS. 3 and 4 includes 27 inputs×20 outputs.

At each intersection of the crossbar switch block 20, a resistance-variable element (switch) is disposed. Referring to FIG. 3, in the case of connecting an input line IN00 and an output line OUT00, a resistance-variable element R(00, 00) is brought into a low-resistance state (ON state), and 26 resistance-variable elements from R(00,01) to R(00,26) other than the resistance-variable element R(00,00) on the output line OUT00 are brought into a high-resistance state (OFF state).

To prevent two or more signals from colliding with each other, for example, only one resistance-variable element out of 27 resistance-variable elements connected to the output line OUT00 is allowed to be turned on. On the other hand, all resistance-variable elements connected to the input line IN00 can be turned on in principle. At this time, the fan-out (abbreviated as F/O) number of the input line IN00 is 20 at maximum. The F/O number of the entire crossbar switch block is also 20 at maximum, and thus the number of resistance-variable elements that can be simultaneously turned on is 20 at maximum out of 27×20 resistance-variable elements.

When one output line is not connected to any of the input lines, the output line is in a floating state and serves as a signal noise generation source. Accordingly, the output line is connected to the ground line by a resistance-variable element. The number of resistance-variable elements to be simultaneously turned on is constantly 20 out of 27×20 resistance-variable elements, including the resistance-variable element for connecting the output line to the ground line.

FIG. 5A is a diagram illustrating a structure of a resistance-variable element. A resistance-variable element 40 includes a resistance-variable layer 41, and a first electrode 42 and a second electrode 43 which are provided on an opposed surface in contact with the resistance-variable layer 41. As the resistance-variable element 40, a ReRAM (Resistance Random Access Memory) using a transition metal oxide as the resistance-variable layer 41, NanoBridge (registered trademark) using an ionic conductor as the resistance-variable layer 41, or the like may be used.

When an ionic conductor is used as the resistance-variable layer 41, metallic ions are supplied from the first electrode 41 to the resistance-variable layer 41, and metallic ions are not supplied from the second electrode 43. For example, metal including copper (Cu) can be used as the first electrode 41, and ruthenium (Ru) can be used as the second electrode 43. The resistance-variable element 40 is a metal precipitation type switch using a movement of metallic ions in an ionic conductor and an electrochemical reaction as the resistance-variable layer 41.

FIG. 5B illustrates a method for switching a resistance value of the resistance-variable element 40. As illustrated in FIG. 5B, the resistance-variable element 40 changes the polarity of a voltage to be applied to the resistance-variable layer 41 between the first electrode 42 and the second electrode 43, thereby making it possible to change a resistance value of the resistance-variable layer 41. A resistance ratio between the low-resistance state (ON state) and the high-resistance state (OFF state) of the resistance-variable layer 41 can be set to, for example, the fifth power of 10, or more. Thus, the resistance-variable element 40 functions as a switch for electrically connecting or disconnecting a wire. Note that as the switch of the resistance-variable element, a switch having a complementary type structure composed of a pair of resistance-variable elements and one transistor can also be used.

To perform static timing analysis of the programmable logic integrated circuit 10, a minimum circuit unit for characterization, which is a series of operations for constructing a delay information library including information such as a delay time for each unit circuit is referred to as a leaf cell. The leaf cell is an analysis circuit for obtaining a delay time or the like for each unit circuit. The leaf cell includes a load capacitance, a load resistance, and a power supply element for driving the load capacitance and the load resistance. The power supply element is a complementary metal oxide semiconductor (CMOS) circuit, and one leaf cell can be defined for one CMOS circuit.

First, load circuits (a wire, a resistance-variable element, a transmission gate or a pass transistor, and an input unit of a subsequent-stage CMOS circuit) which are driven by a CMOS circuit present in the programmable logic integrated circuit 10 are classified into leaf cells. Each leaf cell is characterized by SPICE simulation, and propagation delay information and dynamic power are obtained.

The crossbar switch block 20 illustrated in FIG. 3 includes no power supply when the crossbar switch block operates as a logic circuit, and thus the crossbar switch block can be regarded as a load. The power supply element of the leaf cell including the crossbar switch block 20 is an output BUF of the SMUX. Specifically, the leaf cell having a configuration in which the output BUF is used as the power supply element, and two TMGs, wires in each cell, and two crossbar switch blocks of segments 1 and 2 are used as loads can be employed.

Figure 6:
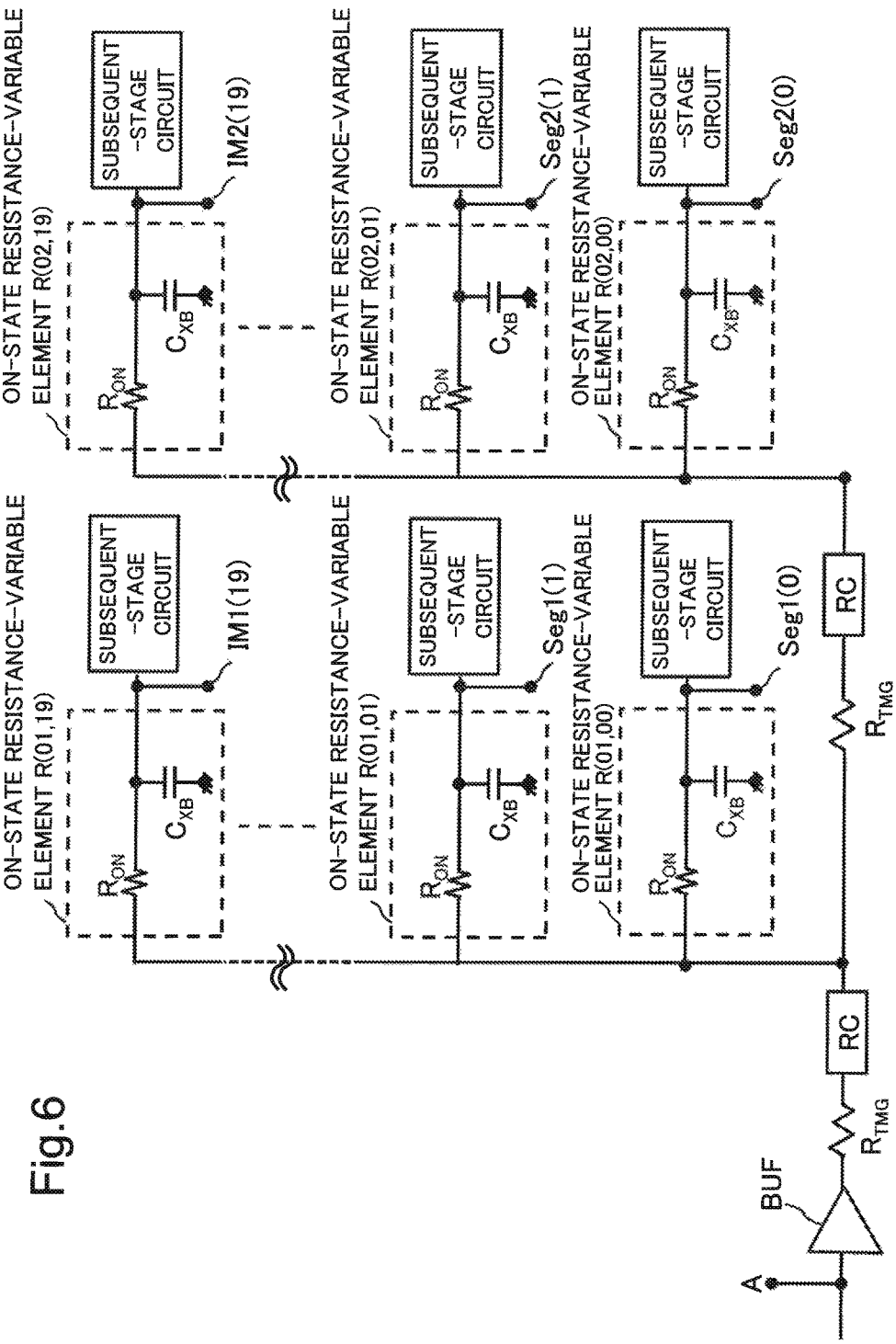
FIG. 6 is a diagram illustrating a configuration of a leaf cell including a crossbar switch of the programmable logic integrated circuit according to the second example embodiment of the present invention.

FIG. 6 is a diagram illustrating a configuration of a leaf cell including a part of the crossbar switch block of the programmable logic integrated circuit according to this example embodiment. The resistance-variable element is represented by an equivalent circuit having a configuration in which a resistance and a capacitance are connected in parallel. In each leaf cell, the output BUF of the SMUX is used as the power supply element. Further, RC in FIG. 6 represents a resistance (R) and a capacitance (C) of the wire.

Referring to FIG. 6, the ON-state resistance-variable element R(01,00) indicates a wire generated when the resistance-variable element located at the 0th output wire in the crossbar switch block in the segment 1 is turned on. The subsequent-stage circuit functions as the BUF when the resistance-variable element in the SMUX is turned on, and the subsequent-stage circuit functions as the LUT when the resistance-variable element in the IMUX is turned on.

One terminal A is provided as an input.

The following four types of 40 outputs are provided: a terminal Seg1 (n=0 . . . 11) connected to the subsequent-stage circuit BUF via the ON-state resistance-variable element within the SMUX in the segment 1; a terminal IM1 (n=12 . . . 19) connected to the subsequent-stage circuit LUT via the resistance-variable element in the ON state within the IMUX in the segment 1; a terminal Seg2 (n=0 . . . 11) connected to the subsequent-stage circuit BUF via the ON-state resistance-variable element within the SMUX in the segment 2; and a terminal IM2 (n=12 . . . 19) connected to the subsequent-stage circuit LUT via the ON-state resistance-variable element within the IMUX in the segment 2. In other words, the leaf cell has the number of inputs of one and the number of outputs of four.

Types of the load of the leaf cell including the crossbar switch block that are necessary for a delay information library for static timing analysis are as follows. In other words, the load capacitance and the load resistance of each leaf cell vary depending on a resistance state of the resistance-variable element of the crossbar switch block. First, the load capacitance and the load resistance vary depending on a combination of the F/O number of the switch block in the segment 1 and the F/O number of the switch block in the segment 2. Second, the load capacitance varies depending on whether the subsequent-stage circuit is the BUF or the LUT. In addition, an input capacitance of the 4-input LUT may vary in each of the four inputs.

When all case classifications as described above are performed, in the segment 1, there are 12 ways for the terminal Seg1 (n=0 . . . 11) to be connected to the subsequent-stage circuit BUF via the SMUX, and there is one way for connecting to the SMUX of Seg2 without passing through the SMUX on a Seg1 side. Therefore, there are 13 ways. Further, in the case of connecting to the subsequent-stage circuit LUT via the IMUX, there can be three ways, i.e., a case where two 4-input (S0, S1, S2, S3) LUTs are both input to, for example, S0, a case where one of the two LUTs is input, and a case where none of the two LUTs are input. Therefore, there are 3×3×3×3 cases. In the segment 2, there are 12 ways for the terminal Seg1 (n=0 . . . 11) to be connected to the subsequent-stage circuit BUF via the SMUX. Further, in the case of connecting to the subsequent-stage circuit LUT via the IMUX, there are 3×3×3×3 ways, like in the segment 1. Accordingly, there are $13 \times 3^4 \times 12 \times 3^4 = 1,023,516$ ways in total. According to the technique of this example embodiment, the number of ways can be drastically reduced.

First, assume that a base leaf cell is used as a leaf cell when the subsequent-stage circuit illustrated in FIG. 6 is the BUF. Output terminals of the base leaf cell correspond to Seg1 and Seg2 illustrated in FIG. 6, and are referred to as BASE_Seg1 and BASE_Seg2, respectively. In a leaf cell which has the same F/O number as that of the base leaf cell and whose subsequent-stage circuit in a part of the segment 1 is the LUT, output terminals IM1 and IM2 appear in addition to the output terminals Seg1 and Seg2. To distinguish the leaf cell from the base leaf cell, the output terminals are referred to as LUT_Seg1, LUT_Seg2, IM1, and IM2, respectively.

Figure 7:
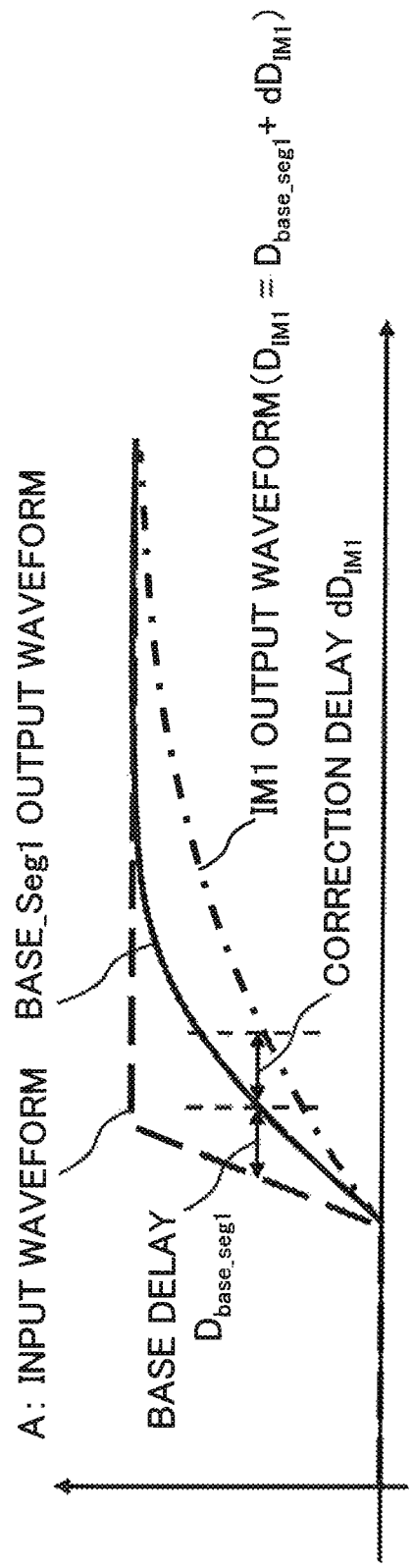
FIG. 7 is a diagram illustrating an input waveform and an output waveform of leaf cells including the crossbar switch of the programmable logic integrated circuit according to the second example embodiment of the present invention.

FIG. 7 is a diagram illustrating an input waveform and an output waveform of a leaf cell. When the input load capacitance of the LUT is larger than that of the BUF, output waveforms of BASE_Seg1 and IM1 with respect to an input waveform A are obtained as illustrated in FIG. 7. When propagation delay times for BASE_Seg1 and IM1 are referred to as $D_{base\_seg1}$ and $D_{IM1}$, respectively, and $dD_{IM1}$ is defined as illustrated in FIG. 7, the following relation is established.

$$D_{IM1} = D_{base\_seg1} + dD_{IM1}$$

where $dD_{IM1}$ is referred to as a correction delay.

Figure 8:
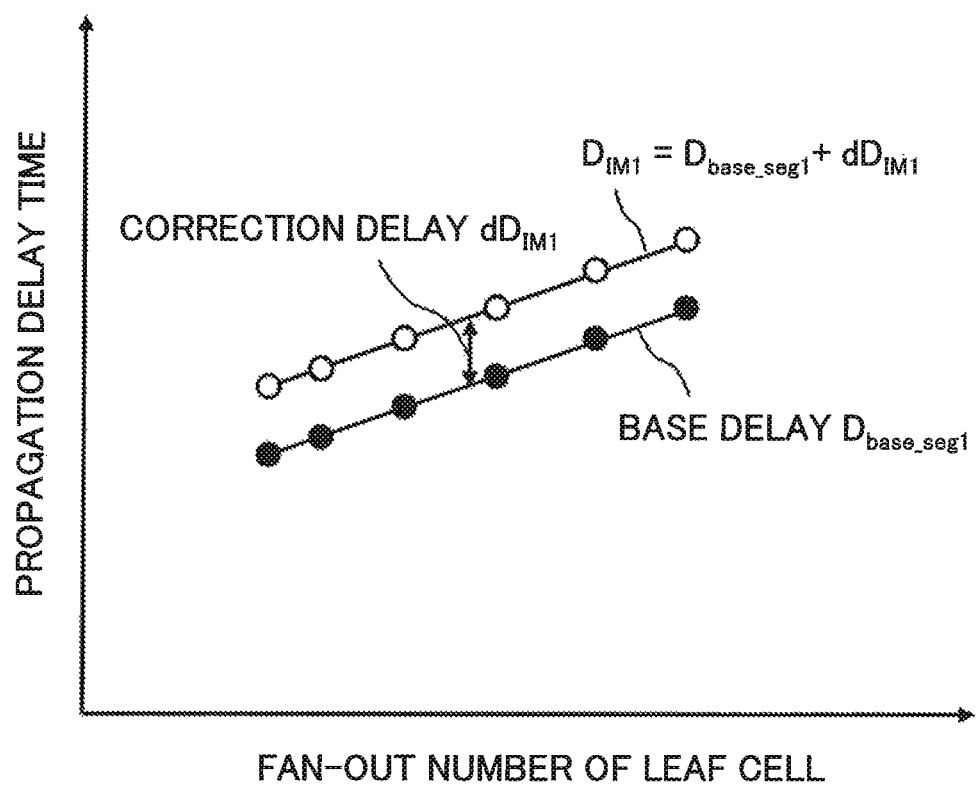
FIG. 8 is a graph illustrating a fan-out number dependence of a propagation delay time of leaf cells including the crossbar switch of the programmable logic integrated circuit according to the second example embodiment of the present invention.

FIG. 8 illustrates an F/O number dependence of each of propagation delay times $D_{base\_seg1}$ and $D_{IM1}$ of a leaf cell. The delay time $D_{base\_seg1}$ for the base leaf cell and the delay time $D_{IM1}$ for the output terminal whose subsequent-stage circuit is the LUT show a linear dependence with respect to the F/O number, and the slopes substantially match. Specifically, a correction delay $dD_{IM1}$, which is a difference between the propagation delay times $D_{base\_seg1}$ and $D_{IM1}$ appearing at BASE_Seg1 and IM1, respectively, is constant independently of the F/O number. Accordingly, $dD_{IM1}$ is independent of the F/O number and is dependent on the load capacitance of the subsequent-stage circuit.

Figure 9:
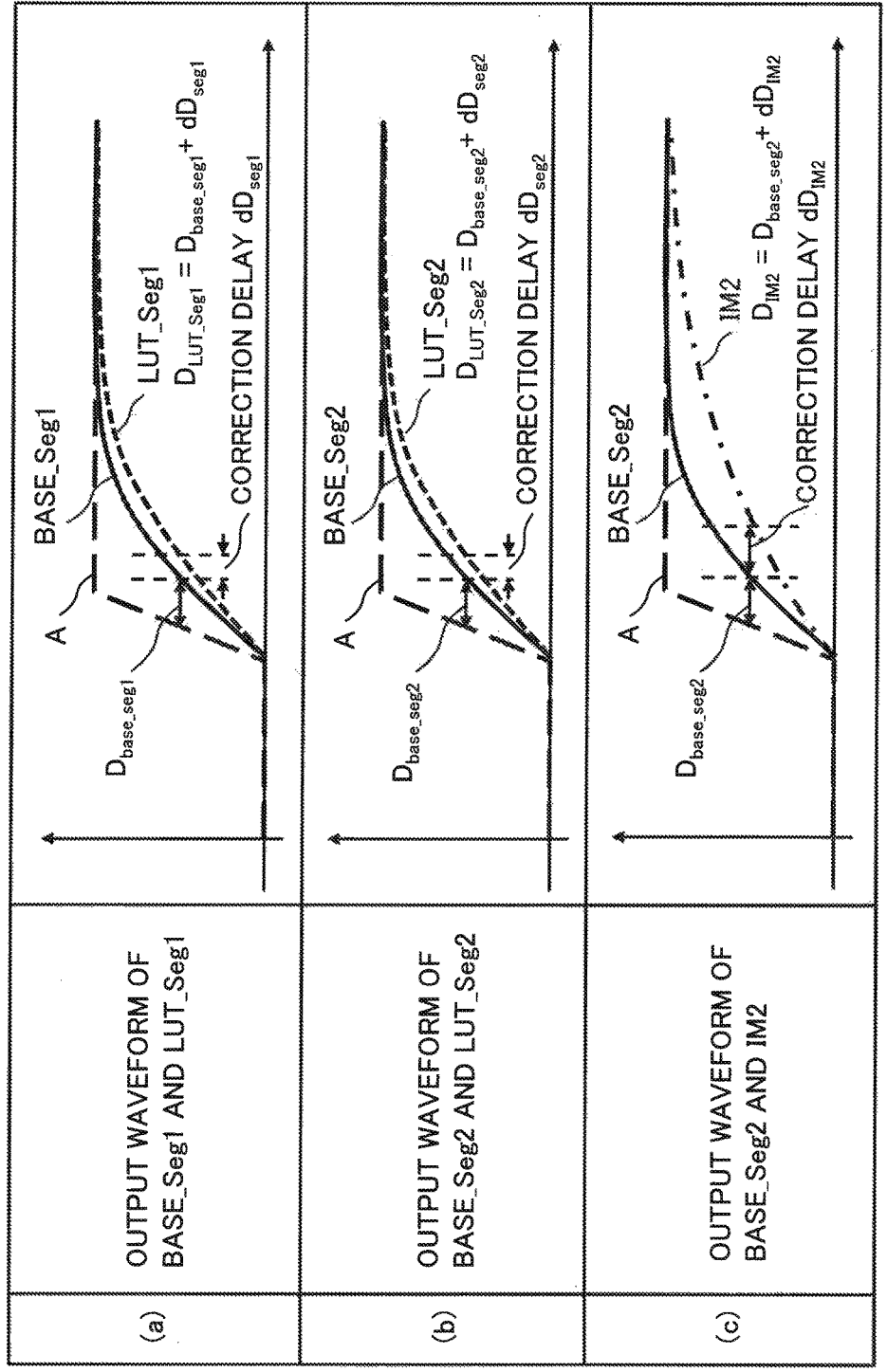
FIG. 9 illustrates graphs each showing an input waveform and an output waveform of leaf cells including the crossbar switch of the programmable logic integrated circuit according to the second example embodiment of the present invention.

FIG. 9 illustrates graphs each showing an input waveform (A) of a leaf cell, and output waveforms of BASE_Seg1, LUT_Seg1, BASE_Seg2, LUT_Seg2, and IM2. As illustrated in FIG. 9, when the propagation delay times of BASE_Seg1, LUT_Seg1, BASE_Seg2, LUT_Seg2, and IM2 are defined as $D_{base\_seg1}$, $D_{LUT\_seg1}$, $D_{base\_seg2}$, $D_{LUT\_seg2}$, and $D_{IM2}$, respectively, and correction delays are defined as $dD_{seg1}$, $dD_{seg2}$, and $dD_{IM2}$, respectively, the following relation is established.

$$D_{LUT\_seg1} = D_{base\_seg1} + dD_{seg1}$$

$$D_{LUT\_seg2} = D_{base\_seg2} + dD_{seg2}$$

$$D_{IM2} = D_{base\_seg2} + dD_{IM2}$$

Like $dD_{IM1}$ described above, the correction delays $dD_{seg1}$, $dD_{seg2}$, and $dD_{IM2}$ are independent of the F/O number and are dependent only on the load capacitance of the subsequent-stage circuit.

Specifically, assuming that the input terminal is represented by A' and the output terminals are represented by LUT_Seg1, IM1, LUT_Seg2, and IM2, respectively, and leaf cells including propagation delay times (correction delays) $dD_{seg1}$, $dD_{IM1}$, $dD_{seg2}$, and $dD_{IM2}$ with respect to the respective output terminals are added to the base leaf cell as correction leaf cells, so that the leaf cell of the switch block including the LUT in the subsequent-stage circuit can be represented by a sum of a base leaf cell and a correction leaf cell.

In the crossbar switch block 20 illustrated in FIG. 3, there are 21×20=420 combinations of the F/O number of the segment 1 and the F/O number of the segment 2. Accordingly, there are 420 base leaf cells with all subsequent-stage circuits being BUFs. There can be three ways of connection to the input terminals of the LUT of the subsequent-stage circuit, i.e., zero, one, and two connections for one input. Since each LUT has four inputs, there are 3×3×3×3=81 ways. Accordingly, there are 81 correction leaf cells in total. In other words, delay information about the switch block can be represented in a million ways with 420+81=501 leaf cells.

Figure 10:
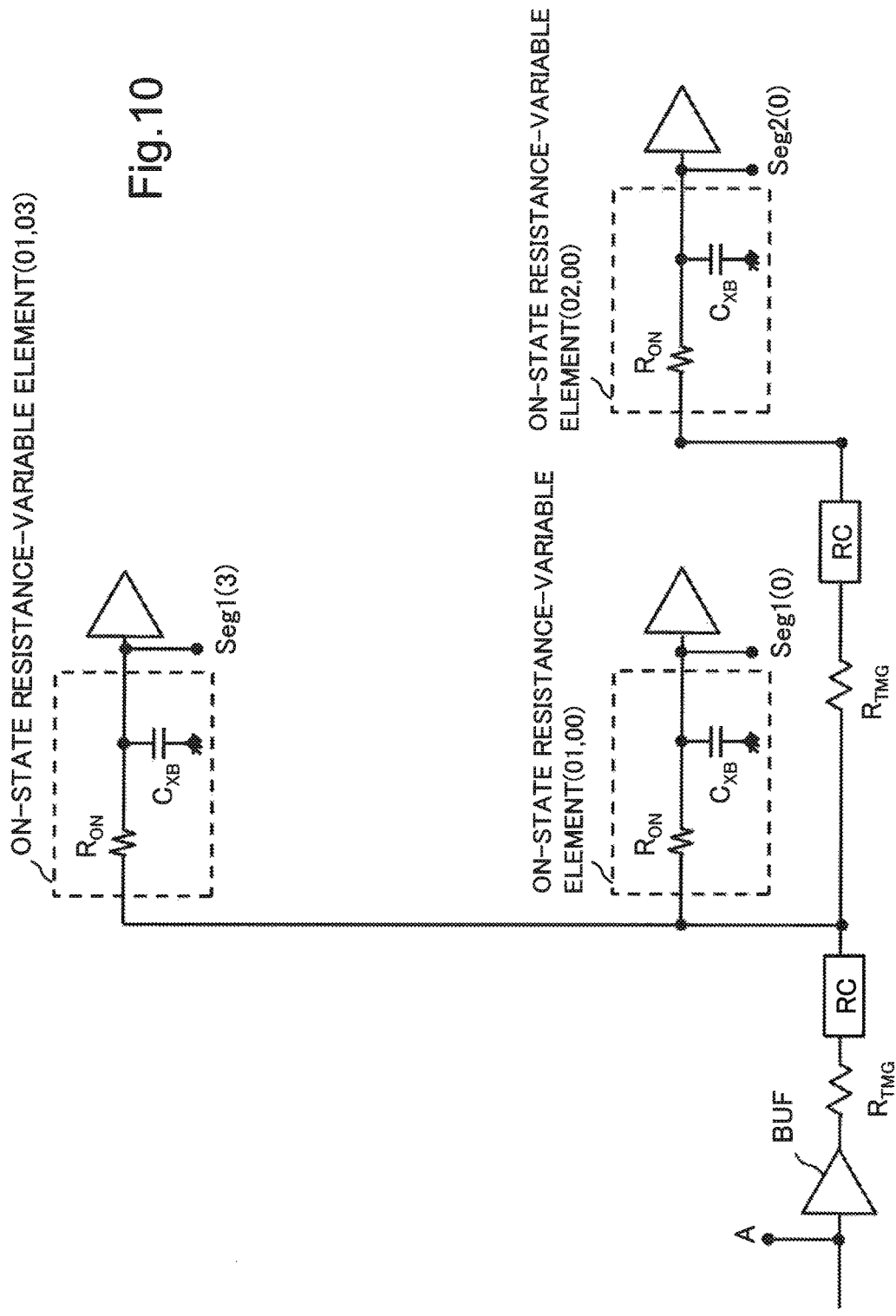
FIG. 10 is a diagram illustrating a connection example 1 of leaf cells including the crossbar switch of the programmable logic integrated circuit according to the second example embodiment of the present invention.

FIG. 10 is a diagram illustrating a connection example 1 of leaf cells including the crossbar switch block 20 of the programmable logic integrated circuit 10. In the connection example 1, the input terminal is represented by A and the output terminals are represented by Seg1(0), Seg1(3), and Seg2(0), respectively. The F/O number of the ON-state resistance-variable element in the segment 1 is 2 (F/O_SEG1), and the F/O number of the ON-state resistance-variable element in the segment 2 is 1 (F/O_SEG2). Accordingly, the base leaf cell has F/O (F/O_SEG1, F/O_SEG2)=F/O(2,1).

Figure 11:
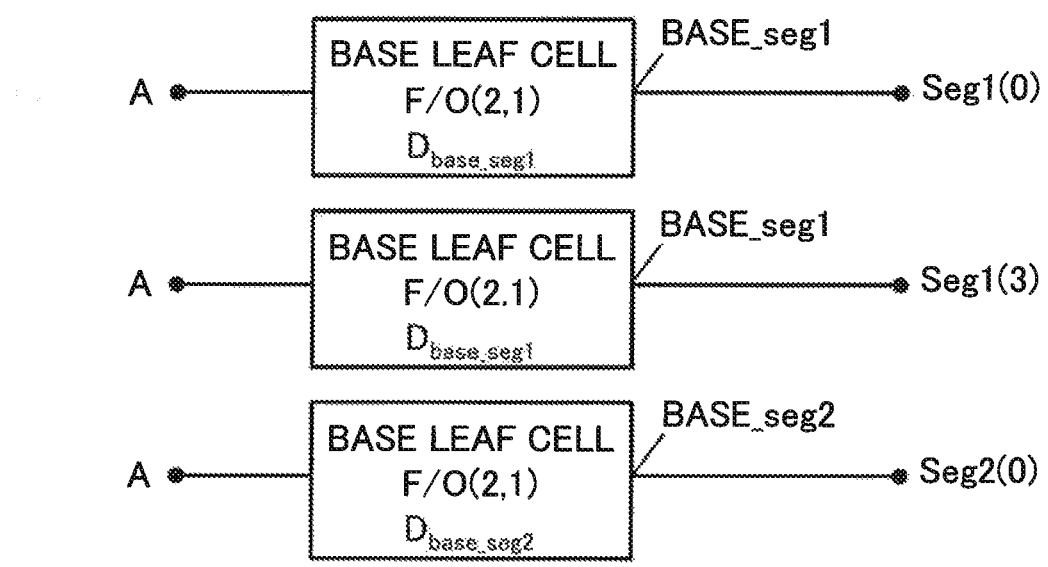
FIG. 11 is a diagram illustrating delay paths for static timing analysis in the connection example 1 of leaf cells including the crossbar switch of the programmable logic integrated circuit according to the second example embodiment of the present invention.

FIG. 11 is a diagram illustrating delay paths for static timing analysis in the connection example 1. In the connection example 1, all the subsequent-stage circuits are BUFs, and thus no correction leaf cell is added.

FIG. 12 is a diagram illustrating a connection example 2 of leaf cells including the crossbar switch block 20 of the programmable logic integrated circuit 10. In the connection example 2, the input terminal is represented by A and the output terminals are represented by Seg1(0), IM1(19), and Seg2(0), respectively. Like in FIG. 10, the base leaf cell has F/O(2,1).

Figure 13:
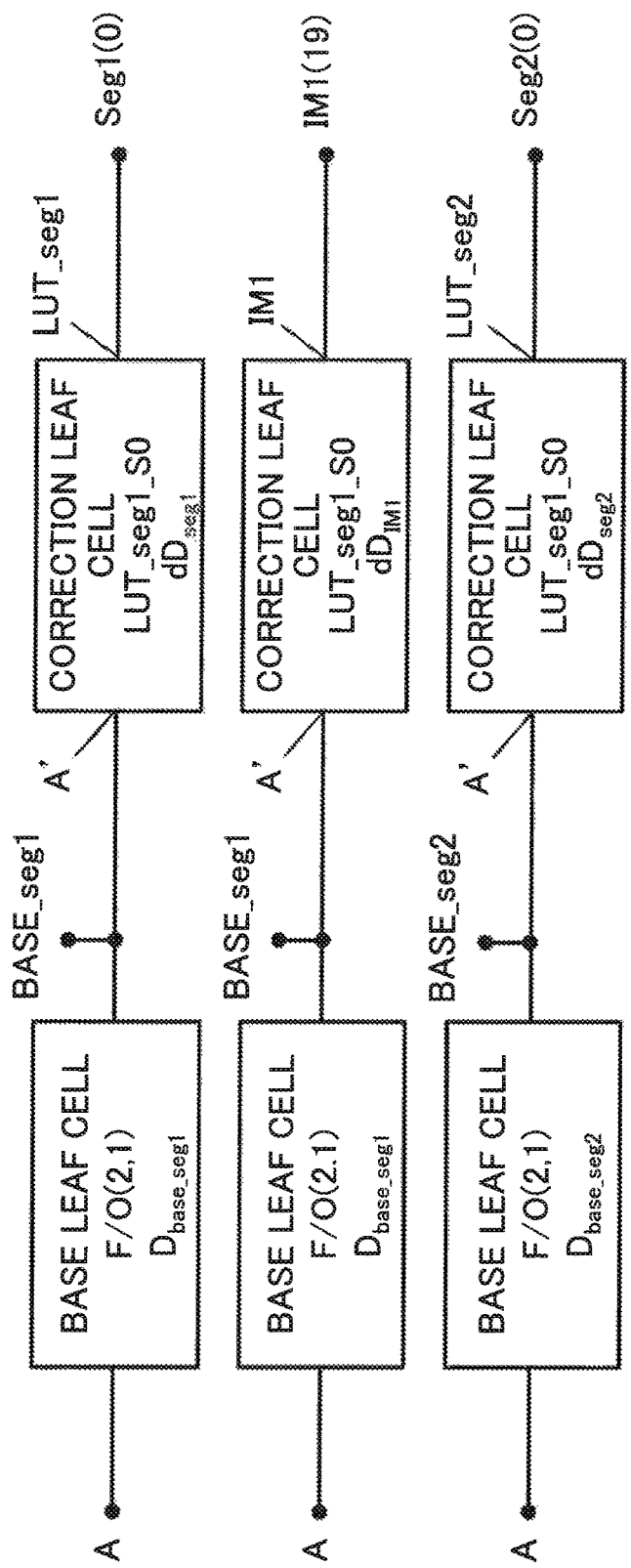
FIG. 13 is a diagram illustrating a delay path for static timing analysis in the connection example 2 of leaf cells including the crossbar switch of the programmable logic integrated circuit according to the second example embodiment of the present invention.

FIG. 13 is a diagram illustrating delay paths for static timing analysis in the connection example 1. The correction leaf cell when the output of the switch block is input to the input S0 of one LUT on the segment 1 side is defined as LUT_seg1_S0. In each delay path of the connection example 2, the correction leaf cell LUT_seg1_S0 is added to the base leaf cell.

Note that both the base leaf cell and the correction leaf cell can include power information. When the power of the base leaf cell is represented by P_BASE and the power of the correction leaf cell is represented by P_LUT, the power of the crossover switch block calculated in the static timing analysis can be expressed by the following formula.

$$P = \Sigma P\_BASE + \Sigma P\_LUT$$

A programmable reconfigurable logic circuit is composed of a repetition of a set of a logic block and a crossbar switch block. Accordingly, a static timing analysis tool used for the circuit verification enables delay calculation with a high accuracy, without taking into consideration a slope of an input signal. Therefore, a wiring load may be loaded into each leaf cell and a library including one piece of propagation delay information or power information for each leaf cell may be created.

Meanwhile, a case where the library including delay information for executing the static timing analysis is a two-dimensional matrix is described below. When the library including delay information is two-dimensional, delay information is obtained in the form of a two-dimensional matrix for a slope of an input signal waveform and an output load capacitance.

There are types of leaf cells including the switch block that correspond to combinations of the F/O number (F/O_SEG1) of the switch block in the segment 1 and the F/O number (F/O_SEG2) of the switch block in the segment 2, in which the load capacitance and the load resistance within each leaf cell vary. In this case, there are 21 (F/O_SEG1=0 to 20)×20 (F/O_SEG2=0 to 19)=420 combinations of F/O.

Assume that, in each leaf cell, a simulation is performed by adding the load capacitance of the subsequent-stage circuit to the slope of each input waveform, and, for example, 5×5 pieces of delay information are created. Specifically, the slope of the input waveform and the load capacitance of the subsequent-stage circuit are set at intervals of "5" in the range from a maximum value to a minimum value. In the calculation of the static timing analysis, a slope of an input waveform and a load capacitance that are not present in the matrix are complemented with near values appropriate to the values set at intervals of "5". In this case, there is a need to obtain 420×25=10,500 pieces of delay information.

Even when two-dimensional delay information is used, the following relation of the sum of the base leaf cell and the correction leaf cell as illustrated in FIGS. 7 and 9 is maintained. There are 420 base leaf cells in total in the leaf cell with all subsequent-stage circuits being BUFs. Since the number of types of output load capacitance is one, the propagation delay information is a one-dimensional matrix only for the slope of the input signal.

There are three ways for the correction leaf cell to be connected to the input terminals of the LUT of the subsequent-stage circuit, i.e., zero, one, and two connections for one input. Since each LUT has four inputs, there are 3×3×3×3=81 ways. As illustrated in FIG. 8, the correction delays $dD_{seg1}$, $dD_{IM1}$, $dD_{seg2}$, and $dD_{IM2}$ are independent of the slope of the input signal waveform. Accordingly, the correction leaf cell is delay information that does not require a matrix.

Therefore, even when the library including the two-dimensional delay information is used, there are only 420+81 leaf cells according to this example embodiment, and at intervals of "5", the delay information can be reduced to 420×5+81=2181 pieces of delay information.

As described above, according to this example embodiment, it is possible to provide a method for effectively performing characterization for circuit verification by static timing analysis of a programmable logic integrated circuit including a crossbar switch using a resistance-variable element.

The present invention is not limited to the example embodiments and examples described above. Various modifications can be made within the scope of the invention described in the scope of claims, and the modifications are also included within the scope of the present invention.

The whole or part of the example embodiments described above can be also described as, but not limited to, the following supplementary notes.

(Supplementary Note 1)

A programmable logic integrated circuit including:

a crossbar switch including a resistance-variable element; and a logic circuit logically configured with the crossbar switch, in which the programmable logic integrated circuit is divided into a plurality of leaf cells including a plurality of load circuits including a part of the crossbar switch, and a power supply element input to the crossbar switch, the leaf cell is divided into delay paths each including a base leaf cell and a correction leaf cell, and circuit verification is performed based on a delay information library in which a delay time for the base leaf cell and a correction delay for the correction leaf cell are integrated into a delay time for the leaf cell.

(Supplementary Note 2)

The programmable logic integrated circuit according to Supplementary note 1, in which in the circuit verification, static timing analysis is performed.

(Supplementary Note 3)

The programmable logic integrated circuit according to Supplementary note 1 or 2, in which the power supply element includes a buffer.

(Supplementary Note 4)

The programmable logic integrated circuit according to any one of Supplementary notes 1 to 3, in which the load circuit includes a load resistance and a load capacitance of the resistance-variable element.

(Supplementary Note 5)

The programmable logic integrated circuit according to any one of Supplementary notes 1 to 4, in which the base leaf cell includes a delay time for the leaf cell to be connected to the power supply element.

(Supplementary Note 6)

The programmable logic integrated circuit according to any one of Supplementary notes 1 to 6, in which the correction leaf cell includes a correction delay for the leaf cell to be connected to the logic circuit.

(Supplementary Note 7)

The programmable logic integrated circuit according to any one of Supplementary notes 1 to 6, in which the logic circuit includes a look-up table, and the crossbar switch changes a connection with the look-up table.

(Supplementary Note 8)

A programmable logic integrated circuit including a plurality of sets of a crossbar switch including a resistance-variable element, and a logic circuit logically configured with the crossbar switch, in which the programmable logic integrated circuit is divided into a plurality of leaf cells including a power supply element provided between an output line of the crossbar switch and an input line of the crossbar switch of a subsequent stage, and a load circuit including a part of the crossbar switch of a subsequent stage, the leaf cell is divided into delay paths each including a base leaf cell and a correction leaf cell, and circuit verification is performed based on a delay information library in which a delay time for the base leaf cell and a correction delay for the correction leaf cell are integrated into a delay time for the leaf cell.

(Supplementary Note 9)

A semiconductor device including the programmable logic integrated circuit according to any one of Supplementary notes 1 to 8.

(Supplementary Note 10)

A characterization method for circuit verification of a programmable logic integrated circuit including a crossbar switch including a resistance-variable element, and a logic circuit logically configured with the crossbar switch, the characterization method including:

dividing the programmable logic integrated circuit into a plurality of leaf cells including a plurality of load circuits including a part of the crossbar switch, and a power supply element input to the crossbar switch;

dividing the leaf cell into delay paths each including a base leaf cell and a correction leaf cell; and integrating a delay time for the base leaf cell and a correction delay for the correction leaf cell into a delay time for the leaf cell.

(Supplementary Note 11)

The characterization method according to Supplementary note 10, in which in the circuit verification, static timing analysis is performed.

(Supplementary Note 12)

The characterization method according to Supplementary note 10 or 11, in which the power supply element includes a buffer.

(Supplementary Note 13)

The characterization method according to any one of Supplementary notes 10 to 12, in which the load circuit includes a load resistance and a load capacitance of the resistance-variable element.

(Supplementary Note 14)

The characterization method according to any one of Supplementary notes 10 to 13, in which the base leaf cell includes a delay time for the leaf cell to be connected to the power supply element.

(Supplementary Note 15)

The characterization method according to any one of Supplementary notes 10 to 14, in which the correction leaf cell includes a correction delay for the leaf cell to be connected to the logic circuit.

(Supplementary Note 16)

The characterization method according to any one of Supplementary notes 10 to 15, in which the logic circuit includes a look-up table, and the crossbar switch changes a connection with the look-up table.

(Supplementary Note 17)

A characterization method for circuit verification of a programmable logic integrated circuit including a plurality of sets of a crossbar switch including a resistance-variable element, and a logic circuit logically configured with the crossbar switch, the characterization method, including:

dividing the programmable logic integrated circuit into a plurality of leaf cells including a power supply element provided between an output line of the crossbar switch and an input line of the crossbar switch of a subsequent stage, and a load circuit including a part of the crossbar switch of a subsequent stage;

dividing the leaf cell into delay paths including a base leaf cell and a correction leaf cell; and integrating a delay time for the base leaf cell and a correction delay for the correction leaf cell into a delay time for the leaf cell.

This application is based upon and claims the benefit of priority from Japanese patent application No. 2015-172470, filed on Sep. 2, 2015, the disclosure of which is incorporated herein in its entirety by reference.

REFERENCE SIGNS LIST 1, 10 Programmable logic integrated circuit
2 Crossbar switch
3 Logic circuit
4 Semiconductor device
20 Crossbar switch block
21 SMUX
22 IMUX
30 Logic block
31 LUT
32 DFF
33 MUX
40 Resistance-variable element
41 Resistance-variable layer
42 First electrode
43 Second electrode

What is claimed is:

1. A programmable logic integrated circuit comprising:
a crossbar switch including a resistance-variable element; and
a logic circuit logically configured with the crossbar switch, wherein
the programmable logic integrated circuit is divided into a plurality of leaf cells including a plurality of load circuits including a part of the crossbar switch, and a power supply element input to the crossbar switch,
the leaf cell is divided into delay paths each including a base leaf cell and a correction leaf cell, and
circuit verification is performed based on a delay information library in which a delay time for the base leaf cell and a correction delay for the correction leaf cell are integrated into a delay time for the leaf cell.

2. The programmable logic integrated circuit according to claim 1, wherein, in the circuit verification, static timing analysis is performed.

3. The programmable logic integrated circuit according to claim 1, wherein the power supply element includes a buffer.

4. The programmable logic integrated circuit according to claim 1, wherein the load circuit includes a load resistance and a load capacitance of the resistance-variable element.

5. The programmable logic integrated circuit according to claim 1, wherein the base leaf cell includes a delay time for the leaf cell to be connected to the power supply element.

6. The programmable logic integrated circuit according to claim 1, wherein the correction leaf cell includes a correction delay for the leaf cell to be connected to the logic circuit.

7. The programmable logic integrated circuit according to claim 1, wherein the logic circuit includes a look-up table, and the crossbar switch changes a connection with the look-up table.

8. A semiconductor device comprising the programmable logic integrated circuit according to claim 1.

9. A programmable logic integrated circuit comprising a plurality of sets of a crossbar switch including a resistance-variable element, and a logic circuit logically configured with the crossbar switch, wherein
the programmable logic integrated circuit is divided into a plurality of leaf cells including a power supply element provided between an output line of the crossbar switch and an input line of the crossbar switch on a subsequent stage, and a load circuit including a part of the crossbar switch on a subsequent stage,
the leaf cell is divided into delay paths each including a base leaf cell and a correction leaf cell, and
circuit verification is performed based on a delay information library in which a delay time for the base leaf cell and a correction delay for the correction leaf cell are integrated into a delay time for the leaf cell.

10. A characterization method for circuit verification of a programmable logic integrated circuit including a crossbar switch including a resistance-variable element, and a logic circuit logically configured with the crossbar switch, the characterization method comprising:

dividing the programmable logic integrated circuit into a plurality of leaf cells including a plurality of load circuits including a part of the crossbar switch, and a power supply element input to the crossbar switch;

dividing the leaf cell into delay paths each including a base leaf cell and a correction leaf cell; and integrating a delay time for the base leaf cell and a correction delay for the correction leaf cell into a delay time for the leaf cell.

11. The characterization method according to claim 10, in which in the circuit verification, static timing analysis is performed.

12. The characterization method according to claim 10, in which the power supply element includes a buffer.

13. The characterization method according to claim 10, in which the load circuit includes a load resistance and a load capacitance of the resistance-variable element.

14. The characterization method according to claim 10, in which the base leaf cell includes a delay time for the leaf cell to be connected to the power supply element.

15. The characterization method according to claim 10, in which the correction leaf cell includes a correction delay for the leaf cell to be connected to the logic circuit.

16. The characterization method according to claim 10, in which the logic circuit includes a look-up table, and the crossbar switch changes a connection with the look-up table.

* * * * *